United States Patent [19]
Ohara et al.

[11] Patent Number: 5,606,295
[45] Date of Patent: Feb. 25, 1997

[54] CRYSTAL OSCILLATOR CIRCUITS

[75] Inventors: Harlan H. Ohara, San Jose; Lee C. Yiu, Fremont, both of Calif.

[73] Assignee: SEEQ Technology, Inc., Fremont, Calif.

[21] Appl. No.: 634,088

[22] Filed: Apr. 17, 1996

[51] Int. Cl.$^6$ ........................................ H03B 5/36
[52] U.S. Cl. .............................. 331/116 FE; 331/108 C
[58] Field of Search .................................. 331/68, 116 R, 331/108 C, 108 D, 116 FE, 117 FE, 117 R, 117 D

[56] References Cited

U.S. PATENT DOCUMENTS

4,873,498  10/1989  Kleinberg ........................ 331/116 FE
5,155,453  10/1992  Ruetz ................................ 331/116 FE

*Primary Examiner*—David Mis
*Attorney, Agent, or Firm*—D'Alessandro & Ritchie

[57] ABSTRACT

A one pin on-chip crystal oscillator circuit and a method of operating that oscillator are provided. The oscillator makes use of the gate-source capacitance of a MOS transistor to provide capacitance which would otherwise need to be provided by one of two oscillator capacitors. The MOS transistor is provided with a floating well by coupling its body to its source, so that the gate-source capacitance does not change substantially when the transistor is turned off. In another aspect of the invention, the MOS transistor is provided with a floating well using a parallel combination of MOS transistor elements, so as to minimize the coupling resistance of the MOS transistor to other elements of the circuit. In another aspect of the invention, the MOS transistor is coupled to a simulated inductive circuit for assuring that the impedance of the two passive oscillator components, normally capacitors, is inductive (will not oscillate) at frequencies near the fundamental frequency of the crystal and capacitive (will oscillate) at frequencies near the third harmonic of the crystal. In another aspect of the invention, the MOS transistor is coupled to a circuit for setting its transconductance by reference to an external component.

34 Claims, 7 Drawing Sheets

CAPACITANCE IS GATE-SOURCE

CRYSTAL OSCILLATOR CIRCUITS

BACKGROUND OF THE INVENTION

1. Field of the Invention

This invention relates to a crystal oscillator for use on an integrated circuit chip, and additionally to a crystal oscillator which operates on a selected odd harmonic without a need for inductors external to the chip.

2. Description of Related Art

In circuits which are integrated onto a semiconductor chip, the number of connectors to off-chip circuits, sometimes called "pins", is often limited. The number of pins may be limited due to the size of the chip, due to added expense of packaging the chip so as to have an increased number of pins, or due to a requirement for compatibility with a previous product. In each of these cases, it is desirable to provide the same functions using fewer pins, or to provide more functions using the same number of pins.

Figure 1:
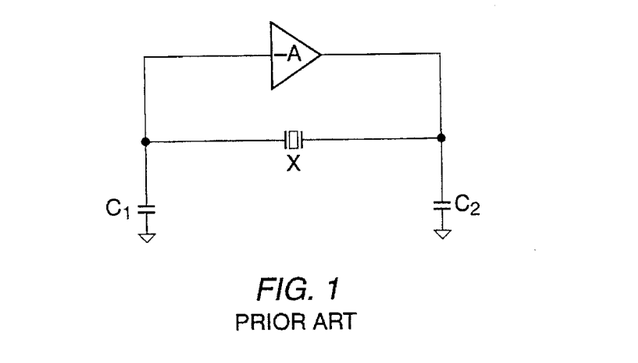
FIG. 1 is a schematic diagram of a prior art two-pin Pierce oscillator circuit.

It is now common for semiconductor integrated circuit chips to include a crystal oscillator circuit on board the chip, to provide a reliable timebase for clock signals and for other timing features. Known circuits for crystal oscillators include two-pin designs such as the Pierce oscillator shown in FIG. 1 which include two relatively large capacitors, $C_1$ and $C_2$, both of which are typically maintained off-chip to avoid using large amounts of on-chip area. The rest of the active circuit is usually then integrated on the chip. The reason for the popularity of this design is that it is flexible in terms of being able to accommodate external parasitics and thus is relatively easy to design.

Figure 2:
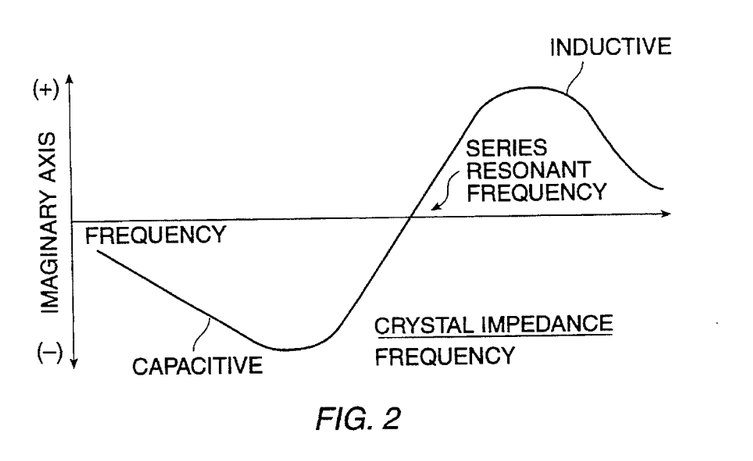
FIG. 2 is a diagram showing impedance (along imaginary axis) as a function of increasing frequency for a typical crystal oscillator component.

Operation of the Pierce oscillator is as follows: (1) the output impedance of the gain stage A in combination with capacitor $C_2$ to ground provides 90° of phase shift above a certain minimum frequency; (2) the crystal X is typically operated in the frequency range where it appears inductive (see FIG. 2). This inductance in combination with both $C_1$ and $C_2$ forms a tank circuit which provides up to another 180° of phase shift at a certain frequency; (3) finally, the gain stage A is inverting and thus provides another 180° of phase shift. This is a total of 450° of phase shift where all that is required for oscillation is 360°. This condition (360° of phase shift) occurs at the resonant frequency of the crystal-$C_1$-$C_2$ combination whose phase shift passes through zero going from +90° to −90° of phase shift, the resonant frequency being given by the formula $f=\frac{1}{2\pi}SQRT(LC)$ where L is the inductance of the crystal, C is the total capacitance of $C_1$ and $C_2$ and "SQRT(x)" is the square root of x.

In view of the desire to provide the same functions using fewer pins, or to provide more functions using the same number of pins, one-pin circuits for crystal oscillators have become desirable.

Figure 3:
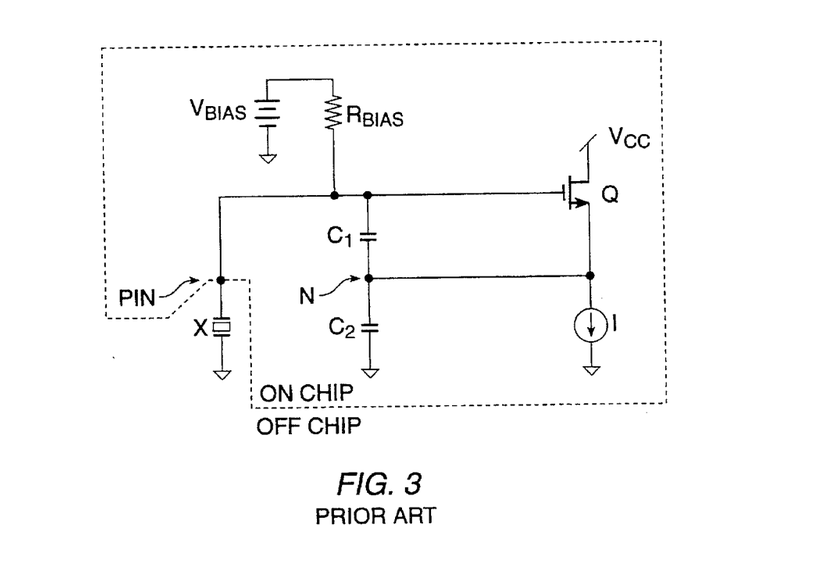
FIG. 3 is a schematic diagram of a prior art one-pin on-chip crystal oscillator circuit.
Figure 4A:
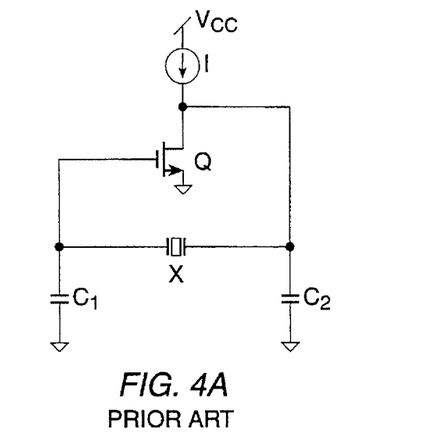
FIGS. 4A, 4B and 4C are a series of equivalent circuits showing electrical equivalence between the circuits of FIG. 1 and FIG. 3.
Figure 4B:
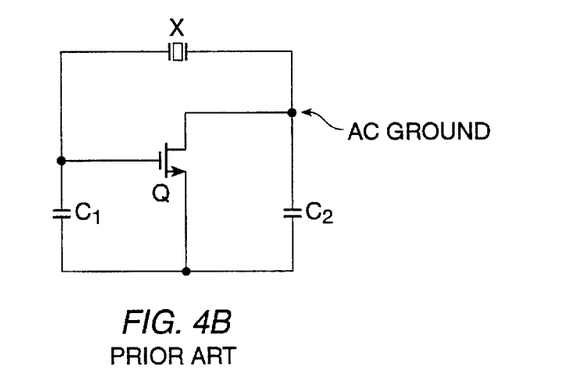
Figure 4C:
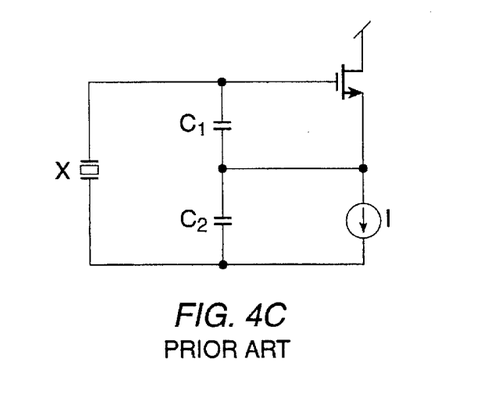

More recently, interest in one-pin oscillator circuit designs such as the Clapp and Colpitts types has resulted in the design shown in FIG. 3. The circuit of FIG. 3 operates much the same as that of FIG. 1. This can be seen by the transformation through equivalent circuits shown successively in FIGS. 4A, 4B and 4C.

One problem which has arisen in the art is that known one-pin designs for crystal oscillators (e.g., FIG. 3) use relatively large capacitors, $C_1$ and $C_2$; these relatively large capacitors use substantial silicon real estate and are therefore disadvantageous. Another problem which has arisen in the art is that such known one-pin designs for crystal oscillators are very susceptible to parasitic capacitance appearing across the crystal (i.e., off of the chip); this problem is commonly addressed by providing a relatively large amplifying transistor as well, but this is disadvantageous for the same reason as it is disadvantageous to use relatively large capacitors in an integrated circuit.

As semiconductor circuits have become faster, shorter clock cycles have become more desirable and crystal oscillators which operate at higher frequencies have become more desirable. However, with higher frequencies, another problem which has arisen in the art is that high frequency crystal oscillators which operate in fundamental mode are subject to significant drawbacks, such as their relatively high expense and relative physical fragility. It has therefore become desirable to operate crystal oscillators in an overtone, such as the third, fifth, seventh, etc. overtone. Of these, the third overtone appears to be most convenient.

Figure 5:
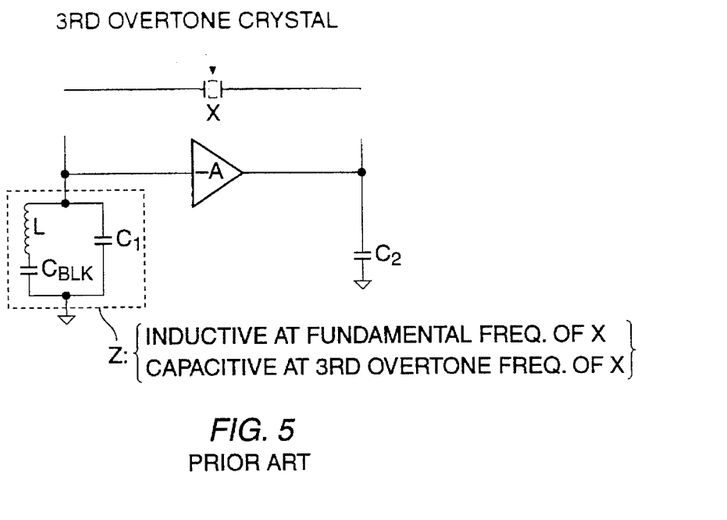
FIG. 5 is a schematic diagram of a crystal oscillator circuit showing how an element which is either inductive or capacitive depending upon frequency can be used to permit oscillation at a selected odd overtone frequency and inhibit oscillation at a fundamental frequency.

Third (fifth, seventh, etc.) overtone operation (hereinafter collectively referred to as odd overtone operation) of a crystal oscillator circuit is achieved by designing the circuit so that the small signal phase shifts around the circuit loop that contribute to oscillation cannot occur at the fundamental frequency of the crystal but will occur normally at the desired overtone frequency of the crystal. This is achieved by arranging the capacitive elements $C_1$ or $C_2$ to be inductive at the fundamental frequency of the crystal and capacitive at the desired overtone frequency. Placing an inductor in parallel with $C_1$ or $C_2$ such that the resonant frequency is between the fundamental frequency of the crystal and the desired overtone frequency of the crystal accomplishes this goal (see, e.g., element "Z" of FIG. 5). When the circuit is seen at the fundamental mode frequency, the inductive characteristic of what used to be just capacitor $C_1$ or $C_2$ makes the phase shifts around the circuit loop add up to a combination which does not result in oscillation at the fundamental frequency of the crystal (i.e., less than 360°).

In a "two-pin" design, an external inductor and capacitor are usually required to make such odd overtone operation possible. In the "one-pin" design, the required inductive/capacitive element needs to be attached to the internal node ("N" in FIG. 3) between the two internal capacitors $C_1$ and $C_2$, thus negating the advantage of the one-pin design as a second pin would therefore have to be brought off of the chip to connect the external component. However, even if a pin is brought out, one still needs an inductor to enable odd overtone operation. The one-pin design saves external components in that the capacitors are now on-chip. It would therefore be highly desirable to implement the odd overtone operation of the oscillator circuit completely on-chip as well in a one-pin design.

There are several disadvantages to present one-pin oscillator circuit designs which limit performance and robustness of the designs.

First, the capacitors previously relegated to off-chip duty ($C_1$ and $C_2$) now have to be placed on-chip because the middle node ("N" in FIG. 3) between the two series capacitors $C_1$ and $C_2$ is not accessible externally. Typically in a MOS process, this requires a double polysilicon process to obtain the requisite capacitance value in a reasonable area or a thin oxide mask using metal to metal, metal to polysilicon, or metal to diffusion as the capacitor plates. Unfortunately, this requires a process which is not common. Known past implementations of on-chip capacitors utilize polysilicon plates or metal-diffusion plates.

Second, the most common configuration for the active circuit is a source follower or emitter follower. For the case of bipolar devices, enough transconductance can be obtained at relatively low bias current. For MOS source followers, obtaining enough transconductance is generally obtained either by making the device physically extremely large or by resorting to using a large amount of bias current in a smaller device. Both alternatives are undesirable.

Third, the presence of external parasitic capacitance in the two-pin case (FIG. 1) is almost always in parallel with the external capacitors to ground and thus add into the operating component values in the circuit. In the one-pin case, parasitic capacitance becomes exactly that—it degrades loop gain and circuit Q. This exacerbates what is already a deficiency, as discussed above. In other words, loop gain is already at a premium due to the difficulty of obtaining enough transconductance with MOS transistors, and additional external parasitic capacitance hurts loop gain and circuit Q. A design adjustment to fix the circuit Q problem is to increase the size of the internal capacitors and to compensate for any external parasitic capacitance. This fixes the Q problem but makes the low transconductance problem even worse. Thus, to adjust for the bigger internal capacitors, the MOS device needs to grow in size as well or more bias current needs to be used—both highly undesirable outcomes.

Fourth, the source follower circuit in the case of MOS is also susceptible to degradation in performance due to the body bias effect of a MOS transistor operated with its source and bulk at different voltage potentials. This effect degrades the loop gain and Q of the circuit in addition to limiting the lower frequency bound of operation.

Finally, as semiconductor circuit functions have become denser, their design has become increasingly dependent on obtaining precise component characteristics. However, this can be difficult to achieve, particularly, when process size and technologies have resulted in smaller and smaller components. Accordingly, another problem is that it is often necessary to design circuits to account for the worst possible (or at least, worst reasonably likely) set of component values. This can be particularly challenging for a precision circuit such as a crystal oscillator.

Accordingly, the present invention provides (1) a reduced area "one pin" crystal oscillator; (2) a crystal oscillator which operates on a selected odd harmonic (such as a third harmonic) without a requirement for inductors external to the chip; and (3) a crystal oscillator which forces certain component values to be proportional to an external component value.

SUMMARY OF THE INVENTION

In a first aspect of the invention, an on-chip crystal oscillator circuit having a single-pin connection to a crystal oscillator element and a method of operating that oscillator are provided. The oscillator makes use of the gate-source capacitance of a MOS transistor to provide capacitance which would otherwise need to be provided by one of two oscillator capacitors, thus providing an oscillator using on-chip elements while using relatively less silicon real estate. The MOS transistor is provided with a floating well by coupling its body to its source, so that the gate-source capacitance does not change substantially when the transistor is turned off.

In a second aspect of the invention, the MOS transistor is provided with a floating well using a parallel combination of MOS transistor elements, so as to minimize the coupling resistance of the MOS transistor to other elements of the circuit. The preferred structure includes a sequence of source-gate-drain structures interspersed with coupling taps to the transistor well. This affords high frequency operation due to the minimization of well resistance.

In a third aspect of the invention, the MOS transistor is coupled to an inductive circuit for assuring that the impedance of one of the two passive oscillator components, normally capacitors, is inductive (i.e., has a positive imaginary component) at frequencies near the fundamental frequency of the crystal and capacitive (i.e., has a negative imaginary component) at frequencies near a selected odd harmonic of the crystal such as the third harmonic. This causes the selected harmonic of the crystal to be the only harmonic of the crystal suitable for stable oscillation, so that the oscillator will operate at that harmonic.

In a fourth aspect of the invention, the MOS transistor is coupled to a circuit for setting its transconductance by reference to an external component, preferably an external resistor. This allows the circuit to be designed relying on a selected transconductance for the MOS transistor, rather than having to design for a range of transconductances which are presented by a particular fabrication process and variations in power supply output and temperature. This external reference type of bias will also be useful in other kinds of analog circuits.

BRIEF DESCRIPTION OF THE DRAWINGS

FIGS. 6A and B are a pair of schematic diagrams showing how, according to the present invention, the gate-source capacitance of a MOS transistor can be used to replace $C_1$ in a conventional two-capacitor oscillator such as that of FIG. 3.

FIGS. 12A, 12B, and 12C show how semiconductor material is disposed to make a multiple transistor oscillator device.

DESCRIPTION OF THE PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

One-Pin Oscillator

From the foregoing background discussion, one trying to design an effective one-pin oscillator circuit for a semiconductor chip might conclude as follows:

First, make the internal capacitors large to preserve circuit Q in the presence of larger external parasitic capacitance; and Second, make the active oscillator device large enough to obtain large transconductance, or else burn more bias current.

Figure 6:
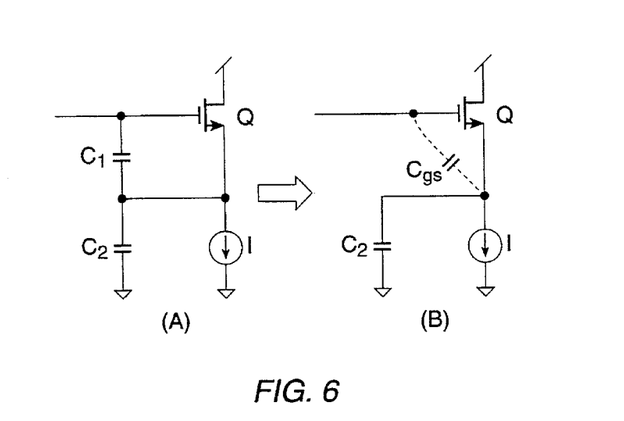

If one were to combine these two conclusions, a lot of area could be saved and one would come out ahead in being allowed more freedom to increase area previously utilized for the capacitors and the active source follower device. This can be done—the source follower gate capacitance can be utilized as one of the capacitors previously constructed separately. This is shown in FIGS. 6A and 6B. In FIG. 6A the prior art arrangement is shown. In FIG. 6B $C_1$ is replaced by the capacitance $C_{gs}$—the gate to source capacitance of the active MOS device. When this is done, one can construct a large capacitor in an efficient manner because the gate capacitance of present day MOS processes is quite high per unit area due to the thin gate oxides used. Additionally, one now has the freedom of utilizing a very large area to construct a very large source follower that provides a large transconductance without the need to burn a lot of bias current as would be needed with a smaller device. The second capacitor, $C_2$ can be constructed from an MOS device as well, obviating the need for any special process requirements and allowing one to build a very good design in a standard low cost MOS process.

There is one additional problem, however, that would cause this initial proposed solution to be rejected. This is due to the fact that the device large signal operation in an oscillator circuit is such that it is turned off a large percentage of the time within one cycle. This being the case, the gate capacitance of the source follower and hence $C_1$ ($C_{gs}$)—one of the capacitors in the circuit needed for operation disappears (or substantially changes value) when the device is cut off. In reality it does not disappear: the gate capacitance goes to being referred to ground rather than from gate to source. Precise analysis of this situation is quite difficult, but in simulations of this behavior, it turns out that the circuit still operates as an oscillator albeit with some undesirable distortions. First, simulations tend to show that the "frequency" of the half cycle in which the capacitance disappears tends to be a little different, suggesting that the operating frequency will be somewhat different than one might predict in the small signal analysis. This can be intuitively explained by imagining what happens. The $C_1$ element suddenly becomes a capacitor to ground rather than appearing across the gate to source. This immediately changes the resonant frequency of the circuit and kills the loop gain. Oscillations do not stop, however, because when the voltage returns to the quiescent point and the gate to source or $C_1$ element returns to a normal value, conditions for oscillation are again satisfied and continue to be satisfied into the other half cycle of operation. An oscillator operated under these conditions would probably not be acceptable under all situations due to the increased harmonic distortion and frequency sensitivity to parasitics. Distortion is increased due to the uneven half cycles and the oscillation frequency not being determined by a definite set of capacitive values.

Figure 7A:
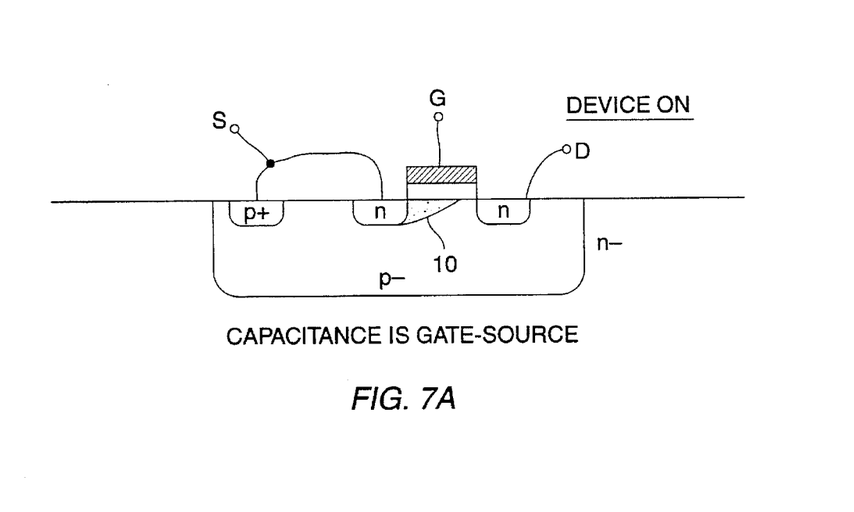
FIGS. 7A and 7B are a pair of cross sectional diagrams of the on-chip MOS transistor Q of FIG. 8 showing how the channel turns on and off with the transistor and where the capacitance is located in the on and off state.
Figure 7B:
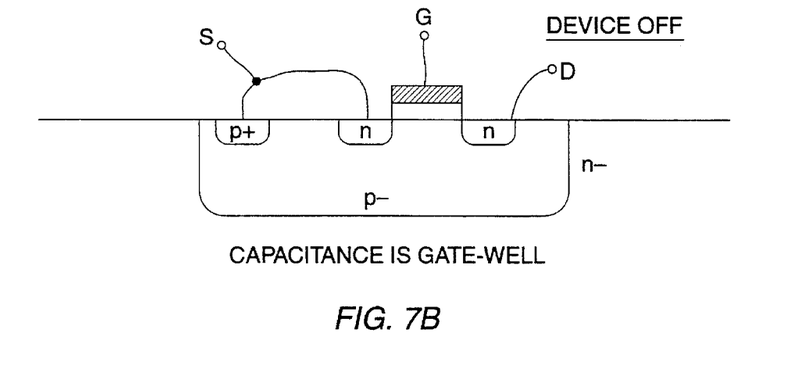

This problem, however, can be eliminated by using a transistor device type with a floating well tied to its source to eliminate the body bias effect that degrades circuit performance, particularly loop gain, Q and low frequency operation. Tying the floating well to its source eliminates the body bias effect, but more importantly, it causes the gate to source capacitance to remain relatively constant over both half cycles with the value of that capacitance being controlled essentially by the oxide thickness of the device—a very precisely controllable value. On the half cycle where the channel (10 in FIG. 7A) is on, the gate capacitance is about 67% of the value of the gate area, while during the other half cycle when the channel is off (FIG. 7B), capacitance is due to the gate to bulk capacitance which is nearly 100% of the gate area. Note that both capacitances are from gate to source, which is exactly what is needed. Simulations of the oscillator operating in this mode show that the waveform is quite clean and oscillations occur at a frequency which is very close to the expected values. Ignoring transients, the capacitance due to the gate in the ON-state is roughly 67% of the capacitance in the OFF-state and thus varies by less than about 50% from channel-on to channel-off to channel-on.

Figure 8:
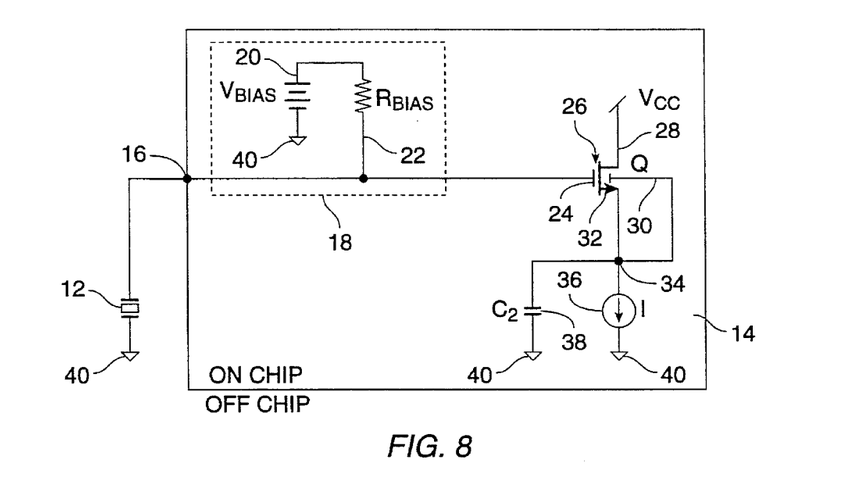
FIG. 8 is a schematic diagram of a one-pin oscillator circuit according to a presently preferred embodiment of the present invention.

FIG. 8 thus shows a presently preferred embodiment of the present invention—a one-pin crystal oscillator. The circuit includes a fundamental mode crystal 12 located off of the chip 14. Crystal 12 is connected to chip 14 via pin 16. Connected to pin 16 is bias circuit 18 which includes a bias voltage supply Vbias 20 and a bias resistor Rbias 22. Also connected to node 16 is gate 24 of N channel MOS transistor 26, the drain 28 of which is connected to Vcc. The well 30 of transistor 26 is connected to its source 32 which is connected to a node 34 in turn connected to a current source 36 and $C_2$ 38; these are, in turn, connected to ground 40.

Selected Odd Overtone Operation

Third (or other selected odd) overtone operation can be implemented by an on-chip inductance that can be attached to the node between the capacitors $C_1$ and $C_2$. In order to do that, an inductor must be simulated on-chip with a circuit which yields an inductance over a frequency range near the fundamental frequency of the crystal oscillator element, which inductance is proportional to some known and fairly constant element that is available either on or off of the chip. This can be done with an external-to-the-chip resistive element which is fairly constant in resistance over a wide range of temperature. This is then used to create a simulated inductor that is proportional to the value of the external resistor and an on-chip MOS capacitor. This provides a reference conductance on-chip which is relatively constant over temperature and process differences and which can be used to bias the oscillator source follower with a current that maintains a constant transconductance over temperature and process differences as well, making the oscillator design even more robust.

With this kind of bias, the oscillator can now have a constant transconductance no matter what the process, temperature or power supply variations are introduced.

Figure 9:
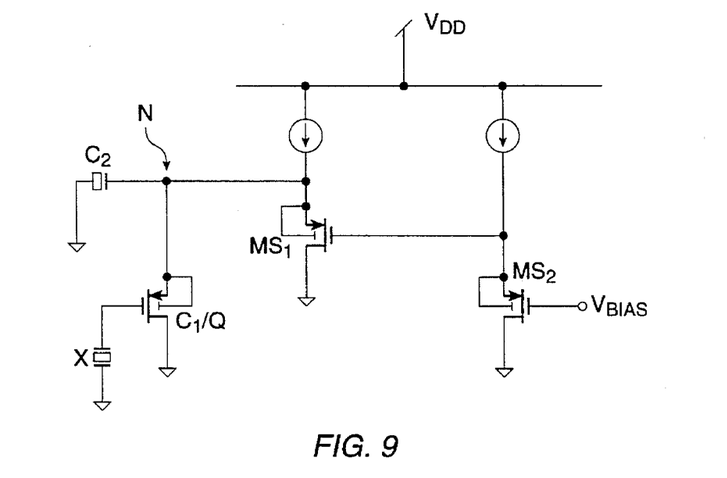
FIG. 9 is a simplified electrical schematic diagram of a one-pin crystal oscillator circuit for operation at a selected odd overtone of the crystal oscillator element.

In addition, it is now possible to create a simulated inductor on-chip. Referring to FIG. 9, a circuit is built with a source follower $MS_1$ biased with the above current so that its transconductance is well controlled and its gate is biased with another source follower $MS_2$ biased with the same current source. In effect, this provides a source follower biased by a dc source on the gate with a constant source impedance. This forms a case where the output impedance of the source follower will become inductive over a certain frequency range. Since the "inductor" is really a circuit simulating an inductor, at the very least we want the simulated inductor to appear as an inductor in a range about the fundamental frequency (and any other lesser de-selected odd overtone frequencies) so as to inhibit resonance of the circuit at such frequencies. Furthermore, its characteristics, whatever they may be, should not inhibit resonance of the circuit at the selected odd overtone resonance frequency. Some replica biasing is also done so that the split of current between the source follower inductive device and the actual oscillator source follower is well controlled.

Full Implementation

Figure 10:
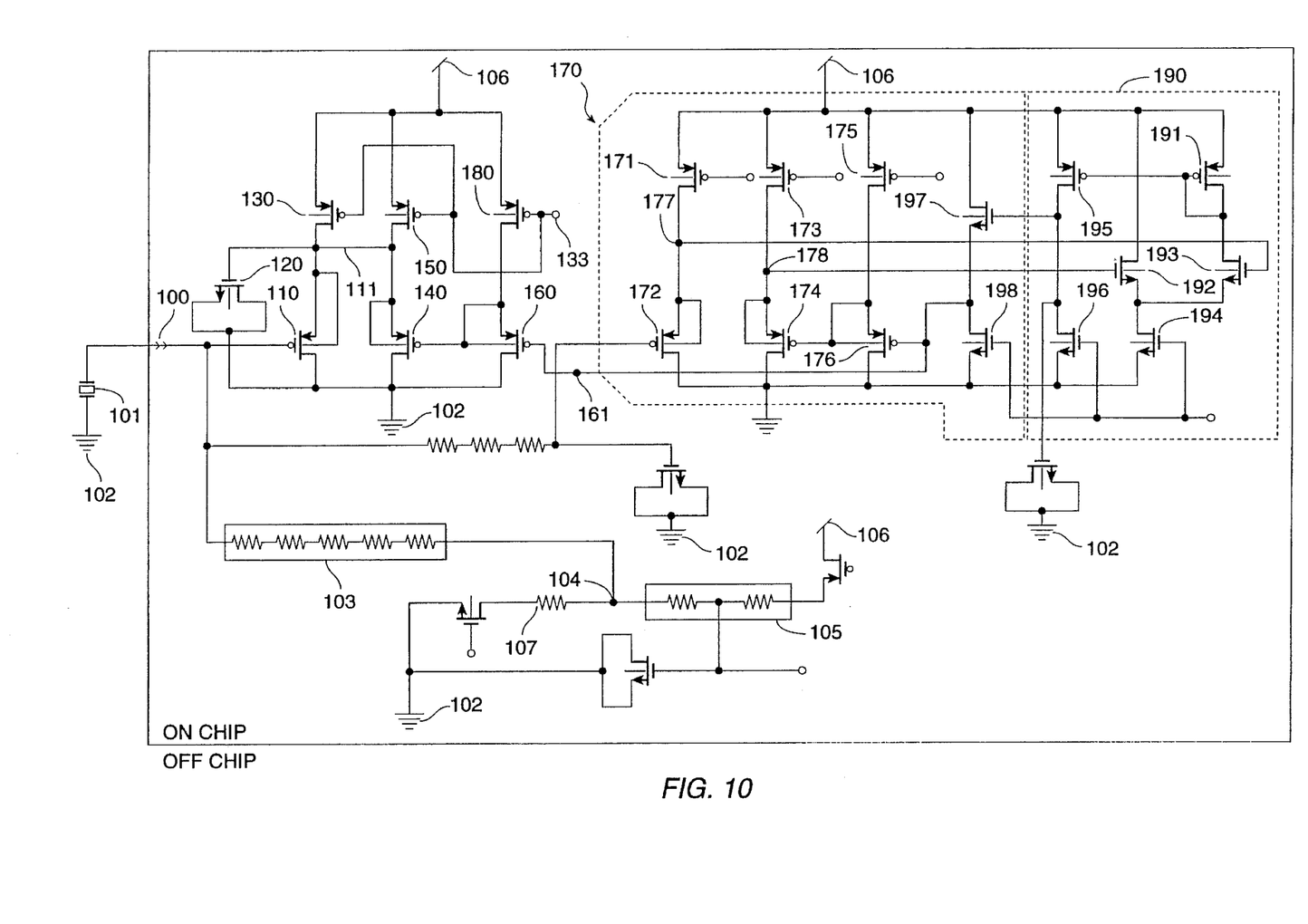
FIG. 10 shows a complete implementation of a one-pin crystal oscillator circuit operating at a selected odd overtone frequency.

FIG. 10 shows a complete implementation of a one-pin crystal oscillator circuit operating at a third overtone frequency. In practice with 0.8 micron process technology, the simulated inductor circuit can be made to work at frequencies up to about 100 MHz and slightly over. This means that the third overtone frequency of the oscillator can operate up to about 300 MHz. Higher overtones will yield even higher frequencies. With reduced size process technology, as presently available, the upper frequency limit of the fundamental frequency will be raised because the smaller physical size of the components enables higher frequency operation.

A node 100 is disposed for coupling to a first side of a quartz crystal 101; a second side of the quartz crystal 101 is coupled to ground 102.

In a presently preferred embodiment employing the various aspects of the present invention, the quartz crystal 101 is located off of the chip and comprises a standard quartz crystal for an oscillator intended to be used at a third overtone frequency. Those of skill in the art will realize that other odd overtone frequencies could be used, as desired.

The node 100 is coupled to the gate of an oscillator transistor XOSC 110, which is a p-channel MOS transistor. The source for the oscillator transistor XOSC 110, at a node 111, is coupled to the body for the oscillator transistor XOSC 110. The node 111 is also coupled to a first plate of a capacitor 120; a second plate of the capacitor 120 is coupled to the drain for the oscillator transistor XOSC 110, which is coupled to ground 102.

The node 100 is also coupled to bias resistor 103, which is coupled to a bias voltage Rbias at a node 104. The bias voltage Rbias at the node 104 is selected using a voltage divider comprising a first resistor 105 coupled to a voltage reference of a selected voltage which, in this case, may be power supply Vdd 106 and a second resistor 107 coupled to ground 102. In a preferred embodiment, power-down switches are provided to open the connection between the node 104 and either ground 102 or the power supply voltage Vdd 106 when power is turned off.

The node 111 is also coupled to a current source transistor 130, which has its drain coupled to the node 111, its source coupled to the power supply voltage Vdd 106, its body tied to power supply voltage Vdd 106, and its gate coupled to a bias voltage Pbias 133.

The bias resistor 103, the voltage bias Rbias at the node 104, the oscillator transistor XOSC 110, the capacitor 120, the current source transistor 130, the power supply voltage Vdd 106, when coupled to the quartz crystal 101 and ground 102, form a Colpitts oscillator, which will oscillate at a frequency responsive to the oscillation frequency of the quartz crystal 101. Note that the transistor XOSC 110 contributes the functionality of two working components, namely, that of being a transistor so as to provide an active device and that of being a capacitor via its built-in gate-source capacitance (here, preferably about 35 picofarads). Although a Colpitts oscillator configuration is preferred, those skilled in the art will recognize, after perusal of this application, that other and further oscillator configurations would be workable in alternative embodiments, would not involve undue experimentation, and are within the scope and spirit of the invention.

The node 111 is also coupled to the source of a transistor XIND 140, which is a p-channel MOS transistor, and whose purpose is to simulate an inductor coupled to the oscillator transistor 110. The source of the transistor XIND 140 is coupled to its body. The drain of the transistor XIND 140 is coupled to ground 102.

The node 111 is also coupled to a second current source transistor 150, which is similar to the first current source transistor 130, and has its drain coupled to the node 111, its source coupled to the power supply voltage Vdd 106, its body tied to power supply voltage Vdd 106, and its gate coupled to the bias voltage Pbias 133.

The transistor XIND 140 and the second current source 150 combine to form a source follower with an impedance which is inductive in nature, i.e., has a positive imaginary component. In alternative embodiments, this source follower 140 and 150 could be coupled to a transistor or other switch circuit for disabling the source follower 140 and 150 in circumstances in which it was desirable to use the fundamental frequency of the crystal 101 instead of the third harmonic of the crystal 101.

The source follower XIND 140 appears inductive due to the resistance present at its gate, which is the resistance presented by the device XINDR 160 (here, preferably about 6800 ohms). It is this resistance which is made proportional to the external resistance Rext. Thus, it is the combination of XIND 140, second current source 150, transistor XINDR 160 and current source transistor 180 which provides the action of a simulated inductor.

The gate for the transistor XIND 140 is coupled to the source and the body of a transistor XINDR 160, which is a p-channel MOS transistor. The drain of the transistor XINDR 160 is coupled to ground 102. The gate of the transistor XINDR 160 is coupled to a node 161, whose voltage is set by a circuit 170 such that the current through the node 111 is apportioned correctly between the oscillator transistor XOSC 110 and the transistor XIND 140, the ratio being set by the size ratios of current source transistors 171 and 173.

The source of the transistor XINDR 160 is coupled to the drain of a current source transistor 180, which is a p-channel MOS transistor. The source of the transistor 180 is coupled to the power supply voltage Vdd 106, and the gate of the transistor 180 is coupled to the reference voltage Pbias 133.

The circuit 170 comprises a first current source transistor 171 and first transistor XDOSC 172, which collectively model the behavior of the current source 130 and the transistor XOSC 110, a second current source transistor 173 and second transistor XDIND 174, which collectively model the behavior of the current source 150 and the transistor XIND 140, and a third current source transistor 175 and third transistor XDINDR 176, which collectively model the behavior of the current source 180 and the transistor 160.

The first current source transistor 1 71 is coupled in like manner as the transistor 130, except that its gate is coupled to the reference voltage Pbias 133 and its drain is coupled to and generates a voltage at a first node 177. The first transistor XDOSC 172 is coupled in like manner as the oscillator transistor XOSC 110.

The second current source transistor 173 is coupled in like manner as the transistor 150, except that its gate is coupled to the reference voltage Pbias 133 and its drain is coupled to and generates a voltage at a second node 178. The second transistor XDIND 174 is coupled in like manner as the transistor XIND 140.

The first node 177 and the second node 178 are coupled to a differential amplifier 190, comprising a first stage comprising a transistor 191, a transistor 192, a transistor 193, and a transistor 194, and a second stage comprising a transistor 195 and a transistor 196. The differential amplifier 190 is coupled to a source follower comprising a transistor 197 and a transistor 198, which generates a voltage at the node 161.

The operation of the circuit 170 is such that the differential amplifier 190 forms a feedback loop with the first current source 171, the first transistor XDOSC 172, and the first node 177, and the second current source 173, the second transistor XDIND 174, and the second node 178, such that the first node 177 and the second node 178 are forced to have equal voltage. As a result, the node 161 is set to a voltage which properly apportions the current between the oscillator transistor XOSC 110 and the transistor XIND 140.

Figure 11:
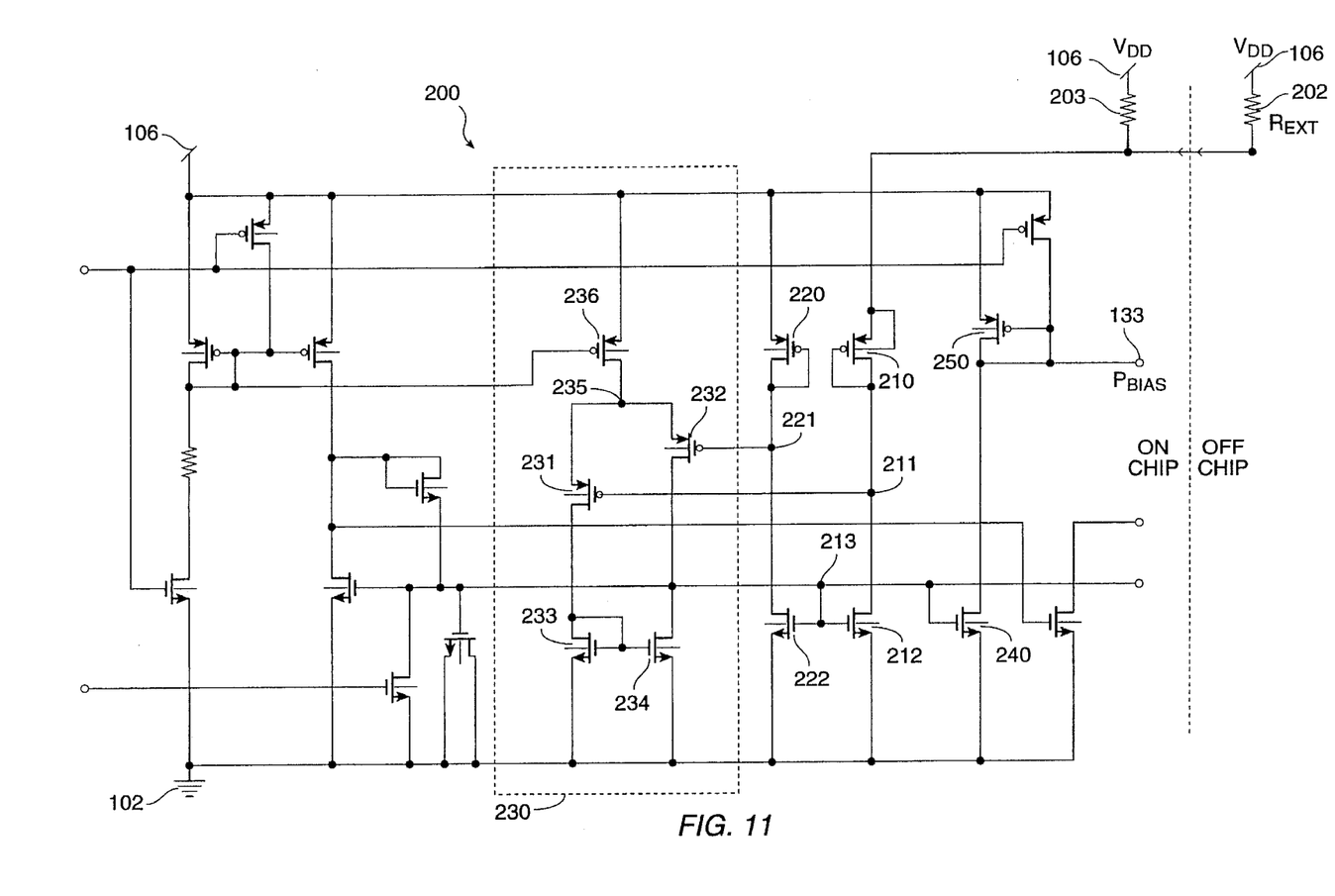
FIG. 11 shows a circuit for developing a bias voltage with reference to an external resistor.

FIG. 11 shows a circuit for developing a bias voltage with reference to an external resistor.

A circuit 200 for developing a bias voltage comprises an external node 201 disposed for coupling to an external resistor 202, the external resistor 202 being coupled to the power supply voltage Vdd 106 and having a resistance Rext. The external node 201 is also coupled to a secondary resistor 203, which is coupled to the power supply voltage Vdd 106, so that the external node 201 is not floated if there is no external resistor 202 present.

The external node 201 is coupled to a transistor 210, which is a p-channel MOS transistor, and which has its source coupled to its body and its gate coupled to its drain, the latter of which is coupled to a first node 211. The first node 211 is coupled to a current source transistor 212, which is an n-channel transistor, and which has its drain coupled to the first node 211, its source coupled to ground 102, and its gate coupled to a node 213.

The power supply voltage Vdd 106 is coupled to a transistor 220, which is a p-channel MOS transistor, and which has its source coupled to the power supply voltage Vdd 106, its body tied to power supply voltage Vdd 106, and its gate coupled to its drain, the latter of which is coupled to a second node 221. The second node 221 is coupled to a current source transistor 222, which is an n-channel transistor, and which has its drain coupled to the first node 221, its source coupled to ground 102, and its gate coupled to the node 213.

The node 213 is coupled to a differential amplifier 230, comprising a transistor 231, a transistor 232, a transistor 233, a transistor 234, and a current source transistor 236, configured in a known configuration for a differential amplifier. The source of the transistor 231 and the source of the transistor 232 are coupled to a node 235, which is coupled by means of the current source transistor 236 to the power supply voltage Vdd 106 (the current source transistor 236 is only turned OFF when the chip, and thus the oscillator circuit, are being powered down). The gate of the transistor 231 is coupled to the node 211; the gate of the transistor 232 is coupled to the node 221. The gate of the transistor 233 and the gate of the transistor 234 are coupled to the drain of the transistor 233. The drain of the transistor 234 is coupled to the node 213.

The node 213 is also coupled to the gate of a current source transistor 240, which has its body and source grounded and its drain coupled to node 133. The current source transistor 240 is calibrated to provide the current needed for the source followers in the circuit of FIG. 1 to have their transconductances proportional to Rext.

The current source transistor 240 is coupled to a current mirror transistor 250, which is a p-channel MOS transistor, and which has its source coupled to the power supply voltage Vdd 106, its body tied to power supply voltage Vdd 106, its gate coupled to its drain, the latter of which is coupled to the drain of the current source transistor 240 and to the node 133 to supply the Pbias reference voltage.

The operation of the circuit 200 is such that the differential amplifier 230 forms a feedback loop with the first node 211 and the second node 221, such that the first node 211 and the second node 221 are forced to have equal voltage. As a result, the delta VDSAT ratio between the transistor 210 and the transistor 220 causes the voltage Pbias to be developed at the node 133 such that the transconductance value for the transistor XOSC 110, the transistor XIND 140 and the transistor XINDR 160 is proportional to Rext, by operation of the current source transistor 130, the current source transistor 150 and the current source transistor 180.

Figure 12A:
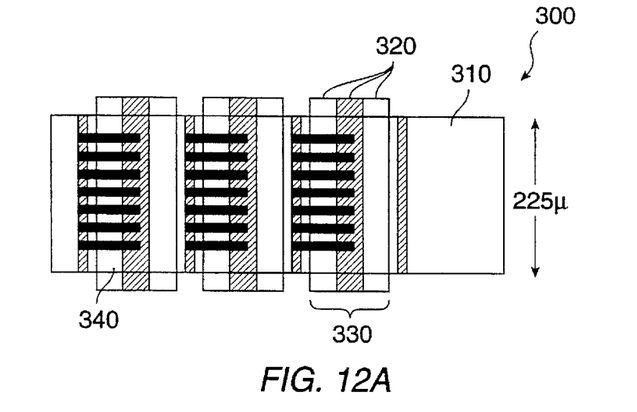
FIG. 12A shows a top view.
Figure 12B:
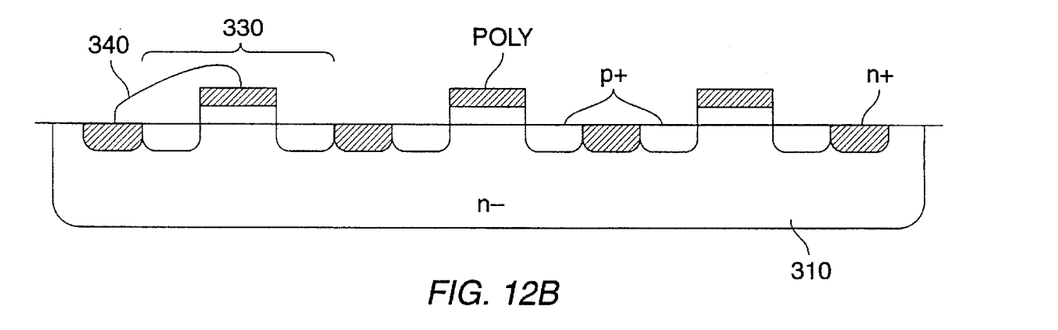
FIG. 12B shows a side view.
Figure 12C:
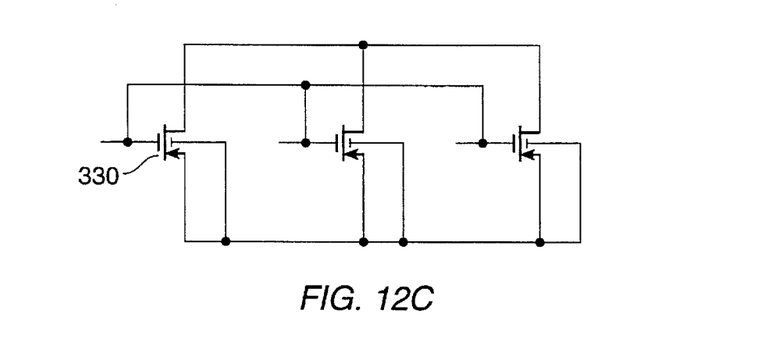
FIG. 12C shows an equivalent circuit.

FIGS. 12A, 12B and 12C show how semiconductor material is disposed to make an oscillator transistor. FIG. 12A shows a top view. FIG. 12B shows a side view. FIG. 12C shows an equivalent circuit.

FIGS. 12A, 12B and 12C show construction of a p-channel transistor; however, those skilled in the art will recognize, after perusal of this application, that other types of components, such as n-channel transistors, would be workable in alternative embodiments, would not involve undue experimentation, and are within the scope and spirit of the invention.

A multiple transistor oscillator device 300 comprises a N-well 310 which comprises a rectangular shape. For example, in a preferred embodiment for the oscillator transistor 110, the length of the well 310 is 300 microns and the width of the well 310 is 250 microns.

The well 310 is crossed by multiple stripes 320 which form the source, the gate, and the drain of multiple transistor elements 330, all coupled in parallel to form a single transistor (shown in FIG. 12C). For example, in a preferred embodiment for the oscillator transistor 110, there are 36 multiple transistor elements 330.

Each transistor element 330 has its body (the well 310) coupled to the its source (one of the stripes 320) using a set of metal wires 340. The gates are of polysilicon, the well contacts are N+, the channels are P+, all as shown in FIG. 12B.

Alternative Embodiments

Although illustrative presently preferred embodiments and applications of this invention are shown and described herein, many variations and modifications are possible which remain within the concept, scope, and spirit of the invention, and these variations would become clear to those of skill in the art after perusal of this application. The invention, therefore, is not to be limited except in the spirit of the appended claims.

What is claimed is:

1. Apparatus comprising a substrate having a monolithic semiconductor circuit on at least one side thereof, said circuit including an oscillator circuit disposed for coupling to a separate crystal oscillator element at a single pin, said oscillator circuit comprising a transistor having a body, a drain, a gate, and a source, said body being coupled to said source, said drain being coupled to a reference voltage, and said source being coupled to a capacitive element.

2. Apparatus as in claim 1, wherein a capacitance between said gate and said source of said transistor is at least about 35 picofarads whenever said circuit is in a power-on state.

3. Apparatus as in claim 1, wherein a capacitance between said gate and said source of said transistor varies by less than about 50% whenever said circuit is in a power-on state.

4. Apparatus as in claim 1, wherein a parasitic capacitance of said transistor does not decrease by more than 50% when said transistor is in an OFF state.

5. Apparatus as in claim 1, wherein said transistor comprises a metal-oxide-semiconductor transistor.

6. Apparatus as in claim 1, wherein a gate resistance of said transistor is less than about 6800 ohms.

7. Apparatus as in claim 1, wherein said transistor comprises a combination of transistor elements coupled in parallel.

8. Apparatus as in claim 1, wherein said transistor comprises:

a well disposed in a generally rectangular region having a first axis and a second axis;

a plurality of source and drain regions disposed sequentially along said first axis and parallel to said second axis; and a plurality of tap regions disposed sequentially along said first axis and each coupled to a corresponding source region.

9. Apparatus as in claim 8, wherein said plurality of source and drain regions comprises at least three independent source regions.

10. Apparatus as in claim 8, wherein said plurality of source and drain regions comprises at least three independent source regions and an equal number of drain regions; and said plurality of tap regions comprises one tap region for each said source region, each said tap region being disposed between a first said source region and a second said source region.

11. Apparatus as in claim 1, wherein said transistor is coupled to an inductor so that an impedance of said oscillator circuit has a positive imaginary component at frequencies below a selected frequency and a negative imaginary component at frequencies above said selected frequency.

12. Apparatus as in claim 11, wherein said selected frequency is a third harmonic of said crystal.

13. Apparatus as in claim 11, wherein said selected frequency is within a range of about 1 megahertz to about 100 megahertz.

14. Apparatus as in claim 11, said apparatus being coupled to a crystal having a fundamental frequency within a range of about 1 megahertz to about 100 megahertz.

15. Apparatus as in claim 1, wherein said transistor is coupled to a circuit for setting its gate resistance by reference to an external resistor.

16. Apparatus as in claim 11, wherein said source of said transistor is coupled to said inductor.

17. Apparatus as in claim 11 wherein said transistor is coupled to a circuit for setting its gate resistance by reference to an external resistor.

18. Apparatus as in claim 16, wherein said transistor is coupled to a circuit for setting its gate resistance by reference to an external resistor.

19. An integrated circuit disposed on a semiconductor die, said circuit comprising:

a current source disposed between a first node and a first power supply potential;

a capacitor disposed between said first node and said first power supply potential; and a MOS transistor having a source, drain, gate and well, said source and well connected to said first node, said drain connected to a second power supply potential, and said gate connected to a node for connection to an off-die crystal oscillator element.

20. The circuit of claim 19, further comprising:

circuit means, inductive below a first frequency of said crystal oscillator element and capacitive above said first frequency, for limiting operation of said circuit to a selected overtone frequency of said crystal oscillator element.

21. A method of operating a crystal oscillator circuit, said method comprising the steps of:

integrating an oscillator circuit into a monolithic semiconductor circuit on at least one side of a substrate, said oscillator circuit comprising a transistor having a body, a drain, a gate, and a source, said body being coupled to said source, said drain being coupled to a reference voltage, and said source being coupled to a capacitive element;

disposing said oscillator circuit for coupling to a crystal at a single pin.

22. A method as in claim 21, further comprising the step of coupling said crystal oscillator to a crystal oscillator element at a single pin.

23. A method as in claim 22, further comprising the steps of:

coupling power to said circuit; and maintaining a capacitance between said gate and said source of said transistor of at least about 35 picofarads.

24. A method as in claim 22, further comprising the steps of:

coupling power to said circuit; and maintaining a capacitance between said gate and said source of said transistor at a relatively constant value which does not change by more than 50% during operation.

25. A method as in claim 22, further comprising the steps of:

coupling power to said circuit;

causing said transistor to switch between an ON state and an OFF state; and preventing a parasitic capacitance of said transistor from decreasing by more than 50% when said transistor is in an OFF state.

26. A method as in claim 22, wherein said crystal has a fundamental frequency within a range of about 1 megahertz and about 100 megahertz.

27. A method as in claim 22, further comprising the step of operating said oscillator circuit at a third harmonic of said crystal oscillator element.

28. A method as in claim 22, further comprising the step of operating said oscillator circuit at a frequency within a range of about 3 megahertz and about 300 megahertz.

29. A method as in claim 21, wherein said step of integrating comprises the steps of:

disposing a well in a generally rectangular region having a first axis and a second axis;

disposing a plurality of source and drain regions sequentially along said first axis and parallel to said second axis; and disposing a plurality of tap regions sequentially along said first axis and each coupled to a corresponding source region.

30. A method as in claim 29, wherein said step of disposing a plurality of source and drain regions comprises disposing at least three independent source regions and an equal number of drain regions; and said step of disposing a plurality of tap regions comprises disposing one tap region for each said source region, each said tap region being disposed between a first said source region and a second said source region.

31. A method as in claim 21, further comprising the steps of:

coupling said transistor an inductor so that an impedance of said oscillator circuit has a positive imaginary component at frequencies below a selected frequency and a negative imaginary component at frequencies above said selected frequency.

32. A method as in claim 31, wherein said selected frequency is a third harmonic of said crystal.

33. A method as in claim 31, wherein said selected frequency is within a range of about 3 megahertz to about 300 megahertz.

34. A method as in claim 21, further comprising the step of coupling said transistor a circuit for setting its gate resistance by reference to an external resistor.

* * * * *

UNITED STATES PATENT AND TRADEMARK OFFICE
CERTIFICATE OF CORRECTION

PATENT NO. : 5,606,295
DATED : February 25, 1997
INVENTOR(S) : Harlan O'Hara, Lee C. Yiu It is certified that error appears in the above-indentified patent and that said Letters Patent is hereby corrected as shown below:

In column 8, line 11, after "contributes" insert --to--.

In column 14, line 5, after "transistor" insert --to--.

In column 14, line 16, after "transistor" insert --to--.

In column 8, line 7, please replace "1 01" with --101--.

Signed and Sealed this

Eighth Day of July, 1997

Attest:

BRUCE LEHMAN

Attesting Officer

Commissioner of Patents and Trademarks